United States Patent [19]

Ohno et al.

[11] Patent Number: 5,632,847
[45] Date of Patent: May 27, 1997

[54] FILM REMOVING METHOD AND FILM REMOVING AGENT

[75] Inventors: Reiko Ohno, Kitakami; Terumi Matsuoka, Okayama, both of Japan

[73] Assignees: Chlorine Engineers Corp., Ltd., Tokyo; Kabushiki Kaisha Toshiba, Kanagawa-ken, both of Japan

[21] Appl. No.: 427,309

[22] Filed: Apr. 24, 1995

[30] Foreign Application Priority Data

Apr. 26, 1994 [JP] Japan .................... 6-088551

[51] Int. Cl.$^6$ .................................... B32B 35/00
[52] U.S. Cl. ................. 156/344; 134/31; 134/902; 216/57
[58] Field of Search ................. 156/344; 134/31, 134/37, 902; 216/57, 58

[56] References Cited

U.S. PATENT DOCUMENTS

| | | | |
|---|---|---|---|
| 4,944,837 | 7/1990 | Nishikawa et al. | 134/31 X |
| 5,288,333 | 2/1994 | Tanaka et al. | 134/31 |
| 5,370,741 | 12/1994 | Bergman | 134/31 X |
| 5,445,679 | 8/1995 | Hansen et al. | 134/1 |
| 5,494,526 | 2/1996 | Paranjpe | 134/31 X |

FOREIGN PATENT DOCUMENTS

| | | |
|---|---|---|
| 58-100433 | 6/1983 | Japan . |
| 4-114428 | 4/1992 | Japan . |
| 5-166776 | 7/1993 | Japan . |

*Primary Examiner*—Mark A. Osele
*Attorney, Agent, or Firm*—Finnegan, Henderson, Farabow, Garrett & Dunner, L.L.P.

[57] ABSTRACT

The method of removing a film from a substrate (wafer) comprises a step of injecting ozone (13) into an acid aqueous solution (12) (e.g., a mixed liquid of dilute hydrogen fluoride aqueous solution and dilute hydrochloric acid); and a step of bringing bubbles (18) formed by the ozone injection step into contact with a film (17) (e.g., organic or metal contaminated film) adhering on to the substrate to remove the film (17) from the substrate (16). Therefore, the organic film or metal contaminated film adhering onto the substrate surface can be removed easily and effectively. Further, the film removing agent is bubbles formed when ozone (13) is injected into an acid aqueous solution. Each bubble is composed of an inside ozone bubble and an outside acid aqueous solution bubble. Therefore, when the bubbles are brought into contact with the film, an intermediate between ozone and the film is first formed, and then the formed intermediate can be removed from the substrate by the acid aqueous solution.

6 Claims, 3 Drawing Sheets

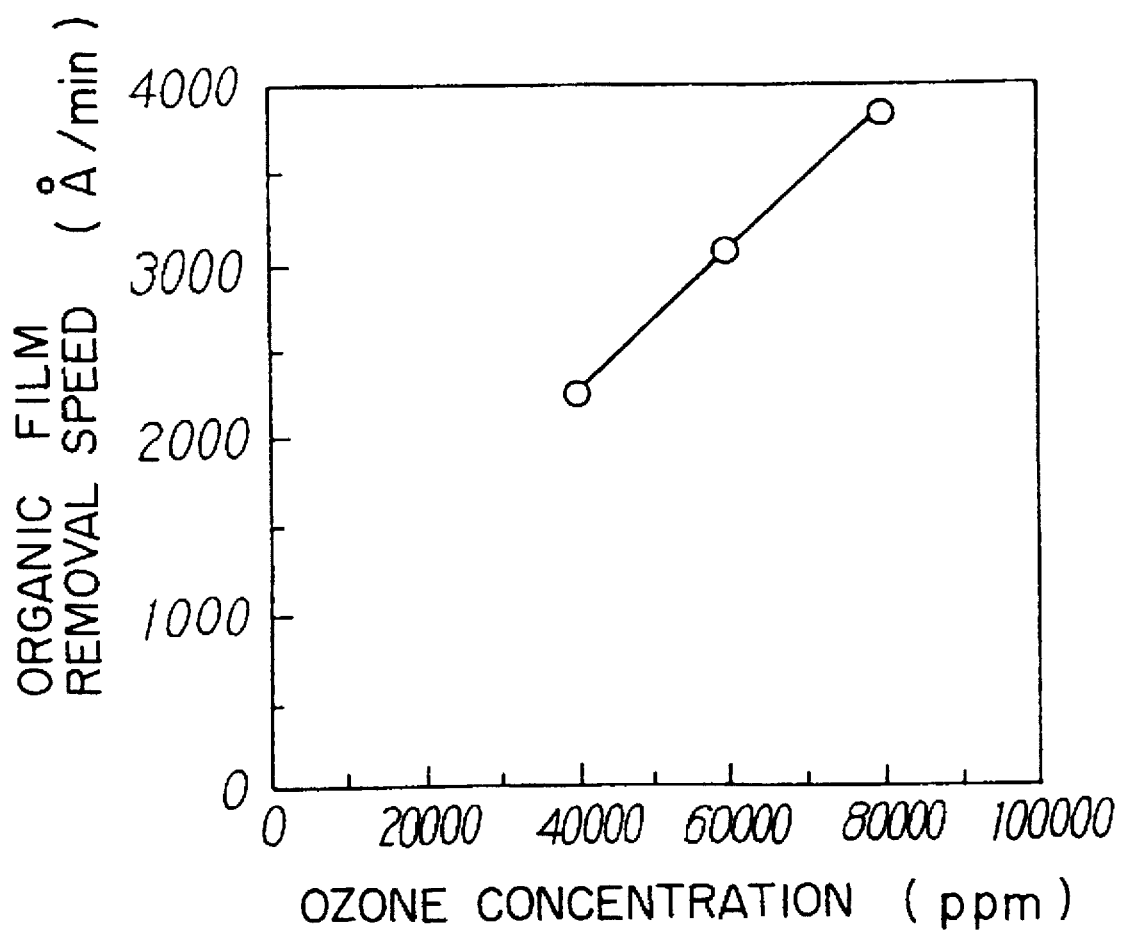
F I G. 3

FILM REMOVING METHOD AND FILM REMOVING AGENT

BACKGROUND OF THE INVENTION

1. Field of the Invention

The present invention relates to a film removing method and a film removing agent used for the method, and more specifically to a method of removing a film and a film removing agent for removing a film from a semiconductor substrate (wafer) in semiconductor manufacturing process or from a glass substrate in liquid crystal manufacturing process.

2. Description of the Prior Art

Conventionally, dry and wet methods have been so far combined, in general, in order to remove a film such as an organic film adhering onto a semiconductor substrate (wafer) during the semiconductor manufacturing process.

In more detail, a high-frequency power is applied to the wafers arranged within an oxygen atmosphere to generate a glow discharge. That is, when the wafers are exposed to the generated glow discharge, an organic film adhering onto each surface of tile wafers can be first removed in the dry method. After that, as shown in FIG. 5(a), the wafers are dipped in a chemical to finally remove the organic film from each wafer surface in the wet method. In this wet method, in more detail, when the wafers 2 already exposed to the glow discharge are dipped in a mixed liquid 1 of concentrated sulfuric acid and hydrogen peroxide both put in a vessel, the organic film can be decomposed to $CO_2$, CO or $H_2O$, so that the inorganic film can be removed chemically from the wafer, respectively. Further, as shown in FIG. 5(b), the wafers 2 are dipped in a pure water 3 put in another vessel to wash the wafers 2 on the basis of dehydrate decomposition reaction or hydrolysis reaction in the pure water 3.

As described above, in the prior art method, whenever the organic film adhering onto the wafer is removed, the dry and wet methods are combined with each other. In the dry method, oxygen plasma is generated within the oxygen atmosphere by the reaction activity due to the glow discharge by the high-frequency power, so that the temperature of the chamber increases as high as 300° to 400° C. As a result, there arise various problems in that the aluminum wiring portions formed on the wafer project abnormally or in that the organic film itself is hardened so that the organic film cannot be peeled off from the wafer.

In addition, in the wet method, since a large amount of the mixed liquid of concentrated sulfuric acid and hydrogen peroxide is used, there exists another problem in that the processing of the waste liquid is costly.

Further, since the dry and wet methods are combined with each other, work time as long as about four hours has been so far required to remove the organic film from the wafer, thus causing another problem in that the productivity is low.

SUMMARY OF THE INVENTION

With these problems in mind, therefore, it is the object of the present invention to provide a method of removing an organic film or a metal contaminated film adhering onto a substrate or wafer effectively and simply, and a film removing agent used therefor.

To achieve the above-mentioned object, the present invention provides a method of removing a film from a substrate, comprising the steps of: injecting ozone into an acid aqueous solution; and bringing bubbles formed when the ozone is injected into the acid aqueous solution, into contact with a film adhering onto the substrate to remove the film from the substrate.

Here, it is preferable that the acid solution is any one of dilute hydrogen fluoride aqueous solution, dilute hydrochloric acid, and a mixed liquid of dilute hydrogen fluoride aqueous solution and dilute hydrochloric acid.

Further, it is preferable that the film is any one of an organic film and a metal contaminated film and the substrate is any one of a semiconductor wafer and a glass substrate.

Further, it is preferable that the acid aqueous solution is an acid aqueous solution as dilute as 5 wt % or less and kept at a room temperature and the concentration of the ozone lies within a range from 40000 to 90000 ppm.

Further, the present invention provides a film removing agent brought into contact with a film adhering onto a substrate to remove the film from the substrate, wherein the film removing agent is a plurality of bubbles formed when ozone is injected into an acid aqueous solution.

Here, it is preferable that the acid aqueous solution is any one of dilute hydrogen fluoride aqueous solution, dilute hydrochloric acid, and a mixed liquid of dilute hydrogen fluoride aqueous solution and dilute hydrochloric acid.

Here, each of the bubbles is composed of an inside ozone bubble and an outside acid aqueous solution bubble.

In the film removing method according to the present invention, when ozone is injected into an acid aqueous solution such as the mixed liquid of hydrogen fluoride aqueous solution and hydrochloric acid, bubbles can be formed. Each of these bubbles is composed of ozone and acid aqueous solution adhering on the outside of the ozone. When the ozone of each bubble is brought into contact with the film on the substrate, an intermediate between ozone and the film is first formed, and then the formed intermediate is removed from the substrate by the acid aqueous solution of each bubble.

BRIEF DESCRIPTION OF THE DRAWINGS

FIG. 3 is a graphical representation showing the relationship between ozone ($O_3$) concentration (ppm) and organic film removal speed (angstrom/min);

DETAILED DESCRIPTION OF THE PREFERRED EMBODIMENTS

The method of removing a film adhering onto the substrate according to the present invention will be described in detail hereinbelow with reference to the attached drawings.

Figure 1:
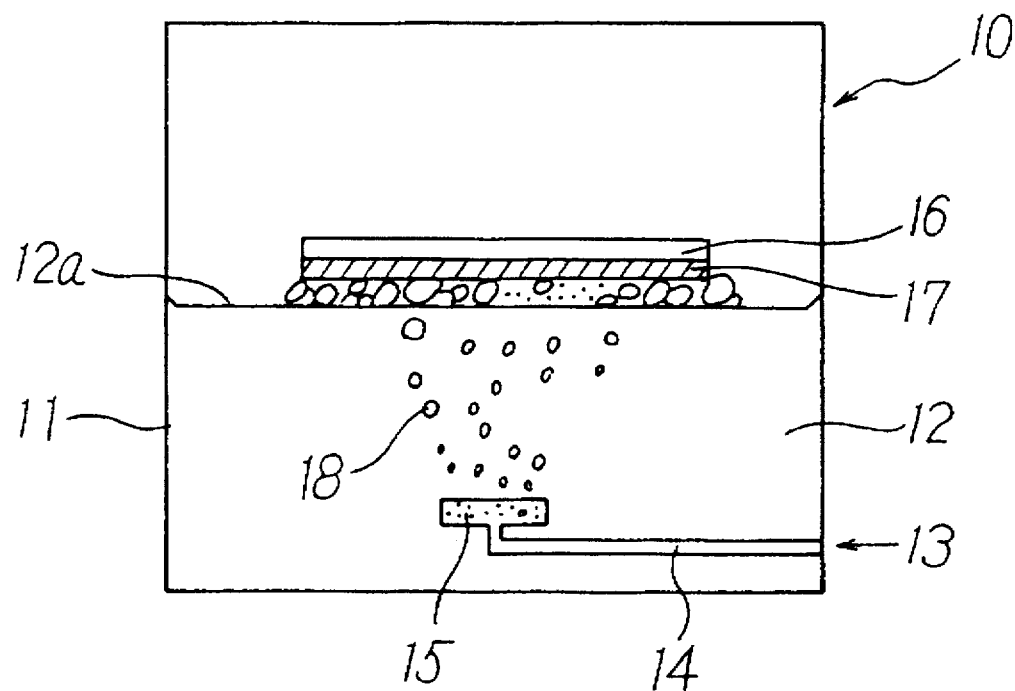
FIG. 1 is a cross-sectional view showing a film removing instrument used for the film removing method according to the present invention.

FIG. 1 shows a film removing instrument 10 used for the method according to the present invention. Into a vessel 11 of the film removing instrument 10, a mixed liquid 12 of dilute hydrogen fluoride aqueous solution and dilute hydrochloric acid is put to a middle height level of the vessel 11. The percent ratio of the dilute hydrochloric acid to the dilute hydrogen fluoride aqueous solution is about 0.5% by weight. The temperature of the mixed liquid 12 is a room temperature (e.g., 25° C.). Further, in the vicinity of the bottom of the vessel 11, a glass bubbler 14 is attached to inject ozone into the mixed liquid 12. Therefore, ozone with a concentration from 40000 to 90000 ppm can be supplied from one (right) end of the glass bubbler 14. A disk-like diffusing member 15 is fixed to the other (left) end of the glass bubbler 14 to diffuse ozone 13 into the mixed liquid 12. The diffusing member 15 is formed with a number of small holes on the upper portion thereof. On the other hand, in the vicinity of an upper level 12a of the mixed liquid 12, a silicon (Si) wafer (substrate) 16 is supported by an appropriate supporting member (not shown) so as to be placed in parallel to the upper level 12a of the mixed liquid 12. An organic film (e.g., photoresist) to be removed is formed being adhered to the lower surface of the wafer 16. Further, the space over the upper level 12a of the mixed liquid 12 is exhausted through an exhaust system (not shown), and the pressure in this space is kept at the atmospheric pressure (e.g., 1 atm).

Figure 2:
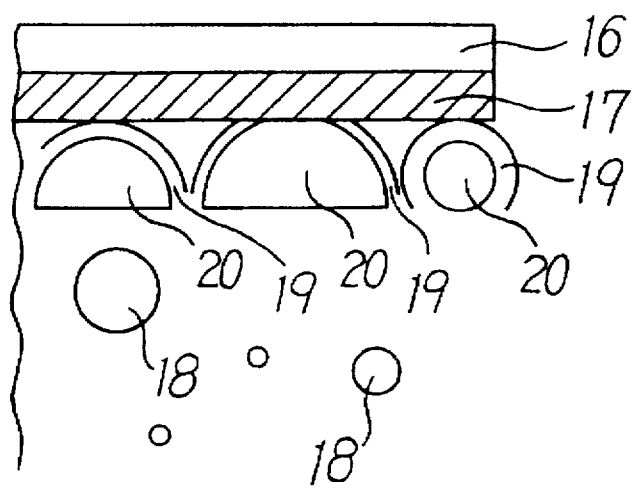
FIG. 2 is an enlarged partial cross-sectional view for assistance in explaining the interface reactions among an organic film, water and ozone.

In the film removing instrument 10 as described above, when ozone is injected into the mixed liquid 12 through the glass bubbler 14, bubbles 18 can be formed in the mixed liquid 12. FIG. 2 shows the interface reaction among the organic film, the acid aqueous solution, and the injected ozone. As shown in FIG. 2, each of the bubbles 18 is composed of an inside bubble 20 of ozone and an outside bubble 19 of dilute hydrogen fluoride aqueous solution or dilute hydrochloric acid. The bubbles 18 move vertically in the mixed liquid 12 and emerge from the upper level 12 of the mixed liquid 12, so that the bubbles 18 are brought into contact with the photoresist 17 formed on the lower surface of the wafer 16. As a result, interface reaction proceeds among the organic film (the photoresist 17), the acid aqueous solution (dilute hydrogen fluoride aqueous solution or dilute hydrochloric acid) and injected ozone. In the reaction, first an intermediate between ozone and the organic film is formed due to contact between both. Secondly, the formed intermediate is removed from the wafer by the acid aqueous solution. After the intermediate has been removed from the surface of the wafer, ozone forms further intermediate. The above-mentioned process is repeated to remove the organic film from the wafer.

Figure 4:
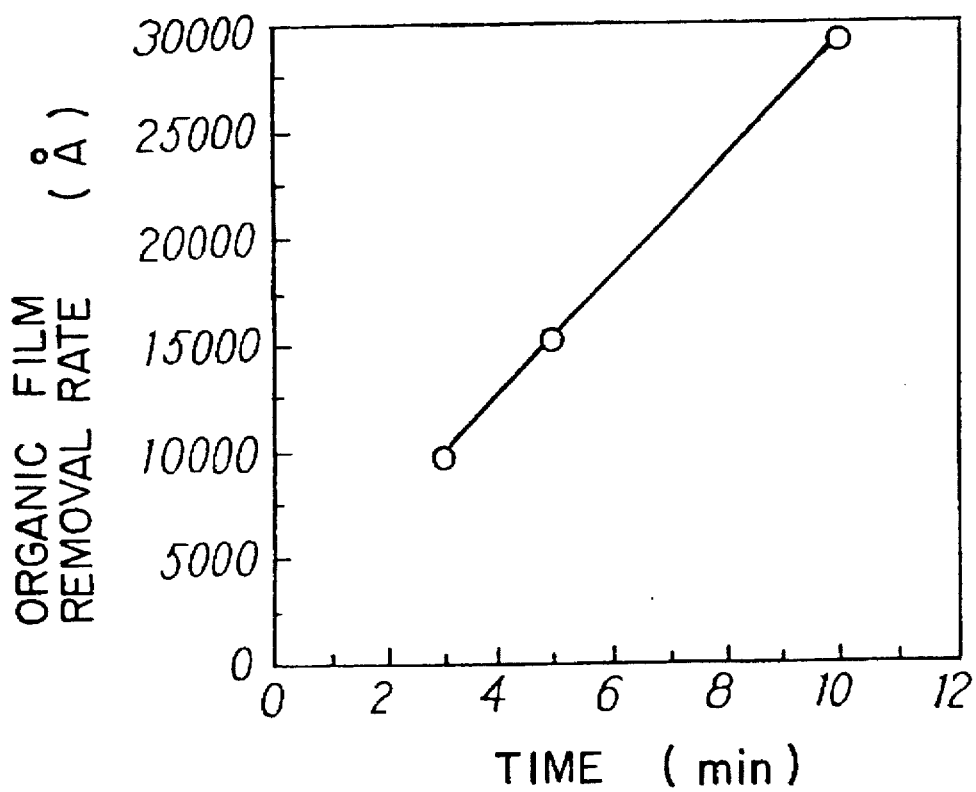
FIG. 4 is a graphical representation showing the relationship between the ozone supply time (min) and the removal rate (thickness: angstrom) of organic film when the ozone concentration is 60000 ppm.
Figures 5A, 5B:
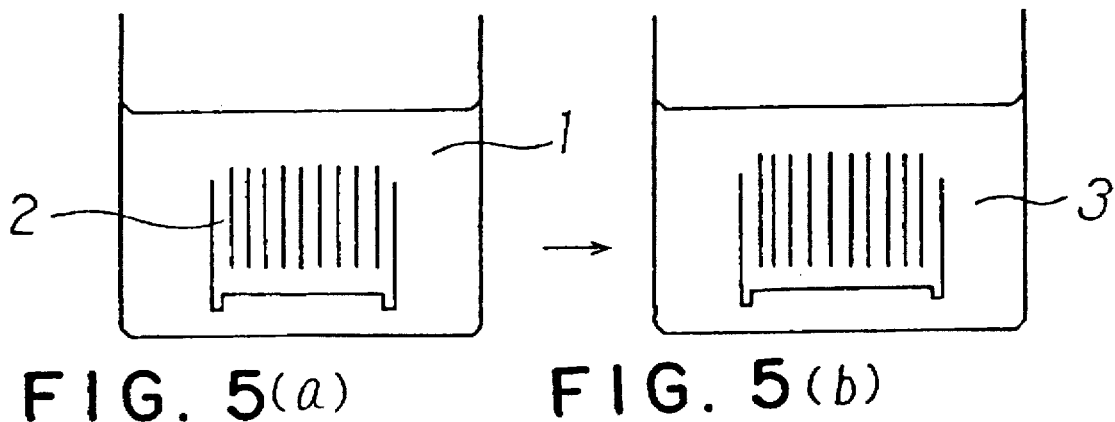
FIGS. 5(a) and (b) are illustrations for assistance in explaining the prior art dry-wet combined method of removing an organic film, in which the organic film is decomposed to $CO_2$, CO or $H_2O$ chemically in FIG. 5(a) and, after that, wafers 2 are washed on the basis of dehydrate decomposition reaction in pure water in FIG. 5(b).

With reference to FIGS. 3 and 4, the test results of the removal of the organic film from the water by use of the film removing instrument 10 as described above will be explained hereinbelow.

FIG. 3 shows the relationship between the concentration (ppm) of ozone ($O_3$) and the removal speed (angstrom/min) of the organic film. FIG. 3 indicates that the organic film removal speed increases in proportion to the ozone concentration. That is, when the ozone concentration is 40000 ppm, the organic film removal speed is 2200 angstrom/min; when the ozone concentration is 60000 ppm, the organic film removal speed is 3000 angstrom/min; and when the ozone concentration is 80000 ppm, the organic film removal speed is 3800 angstrom/min, respectively.

FIG. 4 shows the relationship between the ozone supply time (min) and the removal rate (film thickness) of the organic film when the ozone concentration is kept at 60000 ppm. FIG. 4 indicates that the organic film removal rate (angstrom) increases in proportion to the ozone supply time (min). For instance, when the thickness of the organic film is 15000 angstrom, the processing time required to remove the film is about 5 to 6 min; and when the thickness of the organic film is 30000 angstrom, the processing time required to remove the film is about 10 to 11 min, respectively.

Further, instead of the organic film such as photoresist 17, the cases where a metal-contaminated film (e.g., Na, Fe, Al, Cu, Zn, etc.) adheres on the lower surface of the wafer were also tested by the use of the same film removing instrument 10. The tested wafers are forcibly contaminated by Na, Fe, Al, Cu, or Zn at a contamination rate of about $10^{12}$ to $10^{13}$ atoms/cm$^2$. The test results indicated that the metal contaminated film was removed 90% or more.

As described above, in the method according to the present invention, when ozone of 40000 to 90000 ppm is only injected into a mixed liquid of relatively dilute chemical of about 0.5 wt %, it is possible to easily remove organic film such as photoresist adhering onto the surface of wafer. In addition, since a mixed liquid 12 of dilute chemical is used, it possible to remarkably facilitate the after-processing such as wash or rinse.

Further, being different from the prior art methods which require thermal decomposition reaction as high as 300° to 400° C. in dry method or which require dehydrate decomposition reaction in wet method, in the method according to the present invention, there exist such advantages that it is possible to remove the organic film under the normal environment (i.e., at room temperature and under atmospheric pressure) in spite of a relatively short time. As a result, it is possible to prevent tile aluminum wiring portion from being projected abnormally or the organic film itself from being hardened.

Further, there exists such an advantage that metal contaminated film (e.g., Na, Fe, Al, Cu, Zn, etc.) can be also removed as large as 90% or more.

Further, in the above-mentioned description, only the mixed liquid 12 obtained by mixing dilute hydrochloric acid with the dilute hydrogen fluoride aqueous solution has been described. Without being limited only thereto, in the method according to the present invention, any other acid aqueous solution can be used, for instance such as only a dilute hydrogen fluoride aqueous solution or only a dilute hydrochloric acid. That is, the essential and important point to remove the film from the wafer surface is that the bubbles formed when ozone is injected into the acid aqueous solution is composed of ozone and acid aqueous solution. Accordingly, for instance, it is also possible to use a mixed liquid of hydrogen fluoride aqueous solution and sulfuric acid as the acid aqueous solution. Further, although the ozone concentration rage from 40000 to 90000 ppm has been explained, without being limited only thereto, a more wide range of ozone concentration can be of course applied, as far as the ozone supply time is adjusted appropriately.

Further, the method according to the present invention is not limited to only the instrument as shown in FIGS. 1 and 2.

As described above, in the method according to the present invention, it is possible to easily remove a film (such as organic film or metal contaminated film) adhering onto the surface of a substrate therefrom, simply and effectively.

What is claimed is:

1. A method of removing a film from a substrate, comparing the steps of:

supporting the substrate spaced above a surface of an acid aqueous solution so that the film adhering to the substrate is facing the surface of the acid aqueous solution;

injecting ozone into the acid aqueous solution to form bubbles; and bringing the bubbles into contact with the film adhering to the substrate to remove the film from the substrate.

2. The method of removing a film from a substrate of claim 1, wherein the acid solution is any one of dilute hydrogen fluoride aqueous solution, dilute hydrochloric acid, and a mixed liquid of dilute hydrogen fluoride aqueous solution and dilute hydrochloric acid.

3. The method of removing a film from a substrate of claim 1, wherein the film is any one of an organic film and a metal contaminated film.

4. The method of removing a film from a substrate of claim 1, wherein the substrate is any one of a semiconductor wafer and a glass substrate.

5. The method of removing a film from a substrate of claim 1, wherein the acid aqueous solution is an acid aqueous solution as dilute as 5 wt % or less and kept at a room temperature.

6. The method of removing a film from a substrate of claim 1, wherein concentration of the ozone lies within a range from 40000 to 90000 ppm.

* * * * *

UNITED STATES PATENT AND TRADEMARK OFFICE
CERTIFICATE OF CORRECTION

PATENT NO. : 5,632,847
DATED : May 27, 1997
INVENTOR(S) : Reiko OHNO et al.

It is certified that error appears in the above-indentified patent and that said Letters Patent is hereby corrected as shown below:

Claim 1, column 4, lines 62-63, "comparing" should read --comprising--.

Signed and Sealed this

Ninth Day of September, 1997

Attest:

BRUCE LEHMAN

*Attesting Officer*  *Commissioner of Patents and Trademarks*